United States Patent
Hu

(10) Patent No.: US 11,271,066 B2
(45) Date of Patent: Mar. 8, 2022

(54) FLEXIBLE ARRAY SUBSTRATE WITH STRESS CUSHION PART AND DISPLAY DEVICE HAVING THE SAME

(71) Applicant: Wuhan China Star Optoelectronics Semiconductor Display Technology Co., Ltd., Wuhan (CN)

(72) Inventor: Junyan Hu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 242 days.

(21) Appl. No.: 16/614,043

(22) PCT Filed: Oct. 8, 2019

(86) PCT No.: PCT/CN2019/109892
§ 371 (c)(1),
(2) Date: Nov. 15, 2019

(87) PCT Pub. No.: WO2021/022658
PCT Pub. Date: Feb. 11, 2021

(65) Prior Publication Data
US 2021/0335979 A1 Oct. 28, 2021

(30) Foreign Application Priority Data

Aug. 8, 2019 (CN) .......................... 201910731278.9

(51) Int. Cl.
*H01L 27/32* (2006.01)
*H01L 51/00* (2006.01)

(52) U.S. Cl.
CPC ...... *H01L 27/3276* (2013.01); *H01L 27/3246* (2013.01); *H01L 51/0097* (2013.01); *H01L 27/326* (2013.01); *H01L 27/3258* (2013.01)

(58) Field of Classification Search
CPC ............. H01L 27/326; H01L 27/3276; H01L 27/3258; H01L 27/3246; H01L 51/0097; H01L 51/5203–5234
See application file for complete search history.

(56) References Cited

U.S. PATENT DOCUMENTS

| 2012/0161118 A1 | 6/2012 | Jung et al. |
| 2019/0148474 A1* | 5/2019 | Bu ...................... H01L 27/3276 257/40 |
| 2019/0181360 A1* | 6/2019 | Cha ..................... H01L 51/0096 |

(Continued)

FOREIGN PATENT DOCUMENTS

| CN | 109065505 A | * 12/2018 | ......... H01L 27/3258 |
| CN | 109065505 A | 12/2018 | |

(Continued)

*Primary Examiner* — Scott B Geyer

(57) ABSTRACT

A flexible array substrate and a display are disclosed. The flexible array substrate includes a substrate, an insulation layer disposed on the substrate and having a stepped through-hole, an organic photoresist body disposed in the stepped through-hole of the insulation on the substrate, a source/drain electrode wiring disposed over the organic photoresist body, an organic photoresist layer disposed over the source/drain electrode wiring, a photosensitive adhesive layer disposed over the organic photoresist layer, and a stress cushion layer disposed over the source/drain electrode wiring.

17 Claims, 14 Drawing Sheets

(56) References Cited

U.S. PATENT DOCUMENTS

| | | | |
|---|---|---|---|
| 2019/0363154 A1 | 11/2019 | Kaneko et al. | |
| 2020/0161570 A1 | 5/2020 | Bai et al. | |
| 2020/0161571 A1 | 5/2020 | Wu | |
| 2020/0203455 A1* | 6/2020 | Xie | H01L 27/3258 |
| 2021/0083208 A1* | 3/2021 | Yu | H01L 27/3276 |
| 2021/0335975 A1* | 10/2021 | Wang | G09F 9/301 |

FOREIGN PATENT DOCUMENTS

| | | | | |
|---|---|---|---|---|
| CN | 109065583 A | 12/2018 | | |
| CN | 109585514 A | 4/2019 | | |
| WO | 2019030891 A1 | 2/2019 | | |
| WO | WO-2019090961 A * | 5/2019 | ......... | H01L 27/3276 |
| WO | WO-2020113776 A1 * | 6/2020 | ......... | H01L 51/5206 |

\* cited by examiner

FLEXIBLE ARRAY SUBSTRATE WITH STRESS CUSHION PART AND DISPLAY DEVICE HAVING THE SAME

FIELD OF INVENTION

The present disclosure relates to the technical field of flexible display, and specifically to a flexible array substrate which can be used in flexible display, and a display device having the flexible array substrate.

BACKGROUND OF INVENTION

In narrow border type display devices, bendability of a flexible array substrate is usually used to design for pad bending.

For example, as shown in FIG. 1, a conventional flexible array substrate 9 may be divided into an active area A and a pad area P. The active area A is a part that may be used for display, and the pad area P is a part that is used for pad bending. A structure of the pad area P has a substrate 91, an organic photoresist body 92, a source/drain electrode wiring 93, an organic photoresist layer 94, and a photosensitive adhesive layer 95. Under an ideal condition, the source/drain electrode wiring 93 is in a state of force-neutral surface, that is, there is no stress or tiny stress, for example, the stress is minimized by adjusting a thickness or material properties of each layer.

However, since the Young's modulus of all of the photosensitive adhesive layer 95, the organic photoresist layer 94 and the organic photoresist body 92 are very small, which are compared to have a very large difference with the Young's modulus of Polyimide (PI) material in the substrate 91. It is difficult to make the source/drain electrode wiring 93 being in the state of force-neutral surface in a thickness adjustment manner (as shown in FIG. 1). In addition, taking a double-layered PI substrate as an example, since an inorganic layer used for cushioning is provided in the double-layered PI in the substrate 91, while a difference of the Young's modulus between the inorganic layer and the organic photoresist layer 94 and the photosensitive adhesive layer 95 both above the source/drain electrode wiring 93 is very large. It is required to make that a plurality of film layers above the source/drain electrode wiring 93 are thicker, in order to balance the stress when the film layers are bent. However, the organic photoresist layer 94 is associated with an organic photoresist layer 97 within the active area A (covered by a thin film encapsulation layer (TFE) 98). In addition, the organic photoresist body 92 is associated with a source/drain electrode 96 within the active area A. It is caused to that the above thickened space is limited, so that, stress adjustment effect on the source/drain electrode traces 93 is limited by common practices, such as increasing a thickness of the photosensitive adhesive layer 95. In addition, regardless of which thickness of film is added, a width of a bottom border is increased after bending, which is not conducive to realize a display device with a narrow border.

Therefore, the prior art has drawbacks and needs to be improved.

SUMMARY OF INVENTION

The present disclosure provides a flexible array substrate and a display device including the flexible array substrate, in order to solve a problem of stress imbalance at a position for pad bending in the prior art.

In order to achieve the above object, an aspect of the present disclosure provides a flexible array substrate, which includes a substrate; an insulation layer disposed on the substrate, wherein the insulation layer has a stepped through-hole, the stepped through-hole includes a first tapered-hole portion and a second tapered-hole portion, a minimum aperture of the first tapered-hole portion is larger than a maximum aperture of the second tapered-hole portion, and a ring portion is formed between the first tapered-hole portion and the second tapered-hole portion; an organic photoresist body disposed in the stepped through-hole of the insulation layer on the substrate; a source/drain electrode wiring disposed over the organic photoresist body; an organic photoresist layer disposed over the source/drain electrode wiring; a photosensitive adhesive layer disposed over the organic photoresist layer; and a stress cushion layer disposed over the source/drain electrode wiring, wherein the stress cushion layer is disposed in the organic photoresist layer, in the photosensitive adhesive layer, or between the organic photoresist layer and the photosensitive adhesive layer.

In some embodiments, the organic photoresist layer includes a planarization layer and a pixel definition layer, and the stress cushion layer is disposed between the planarization layer and the pixel definition layer.

In some embodiments, a thickness of the stress cushion layer is varied as a distance from the source/drain electrode wiring, and wherein the thickness of the stress cushion layer is thicker as the stress cushion layer is closer to the source/drain electrode wiring.

In some embodiments, the stress cushion layer consists of at least one of an inorganic film layer, a metal film layer, and an organic film layer.

In some embodiments, the stress cushion layer is shaped as a sliced structure or a patterned structure.

In some embodiments, the insulation layer and the organic photoresist body are disposed on a same surface of the substrate, wherein an outside diameter of the organic photoresist body is gradually increased from an end of the organic photoresist body close to the substrate toward the other end of the organic photoresist body away from the substrate.

In some embodiments, a shoulder is formed on an outer circumferential surface between two ends of the organic photoresist body.

In order to achieve the above object of the present disclosure, another aspect of the present disclosure provides a flexible array substrate, which includes a substrate; an insulation layer disposed on the substrate, wherein the insulation layer has a stepped through-hole; an organic photoresist body disposed in the stepped through-hole of the insulation layer on the substrate; a source/drain electrode wiring disposed over the organic photoresist body; an organic photoresist layer disposed over the source/drain electrode wiring; a photosensitive adhesive layer disposed over the organic photoresist layer; and a stress cushion layer disposed over the source/drain electrode wiring.

In some embodiments, the stress cushion layer is disposed in the organic photoresist layer, in the photosensitive adhesive layer, or between the organic photoresist layer and the photosensitive adhesive layer.

In some embodiments, the organic photoresist layer includes a planarization layer and a pixel definition layer, and the stress cushion layer is disposed between the planarization layer and the pixel definition layer.

In some embodiments, a thickness of the stress cushion layer is varied as a distance from the source/drain electrode wiring, and wherein the thickness of the stress cushion layer is thicker as the stress cushion layer is closer to the source/drain electrode wiring.

In some embodiments, the stress cushion layer consists of at least one of an inorganic film layer, a metal film layer, and an organic film layer.

In some embodiments, the stress cushion layer is shaped as a sliced structure or a patterned structure.

In some embodiments, the insulation layer and the organic photoresist body are disposed on a same surface of the substrate, wherein an outside diameter of the organic photoresist body is gradually increased from an end of the organic photoresist body close to the substrate toward the other end of the organic photoresist body away from the substrate.

In some embodiments, a shoulder is formed on an outer circumferential surface between two ends of the organic photoresist body.

In some embodiments, the stepped through-hole comprises a first tapered-hole portion and a second tapered-hole portion, a minimum aperture of the first tapered-hole portion is larger than a maximum aperture of the second tapered-hole portion, and a ring portion is formed between the first tapered-hole portion and the second tapered-hole portion.

In order to achieve the above object, another aspect of the present disclosure provides a display device, which includes the above flexible array substrate.

Compared with the prior art, the flexible array substrate and the display device including the flexible array substrate of the present disclosure are provided with the stress cushion layer (for example, the Young's modulus ranging from 50 to 200 GPa) in one of film layers above the source/drain electrode wiring. When the pad area (i.e., around the organic photoresist body) of the flexible array substrate is bent, the stress in the flexible array substrate can be balanced. In this way, a problem of stress imbalance at a position for pad bending in the prior art can be solved, and there is no disadvantage of increasing the thickness of the film layers in the prior art, which is advantageous for realizing a display device with a narrow border.

DETAILED DESCRIPTION OF PREFERRED EMBODIMENTS

Following descriptions of the various embodiments refers to additional drawings for illustrating specific embodiments of the present disclosure. Furthermore, directional terms mentioned in the present disclosure, such as upper, lower, top, bottom, front, rear, left, right, inner, outer, side, around, central, horizontal, lateral, vertical, longitudinal, axial, radial, the uppermost layer, and the lowermost layer, which only refer to the direction of drawings. Therefore, the directional terms are used for the purpose of illustration and understanding of the present disclosure, and are not intended to limit the present disclosure.

Figure 2:
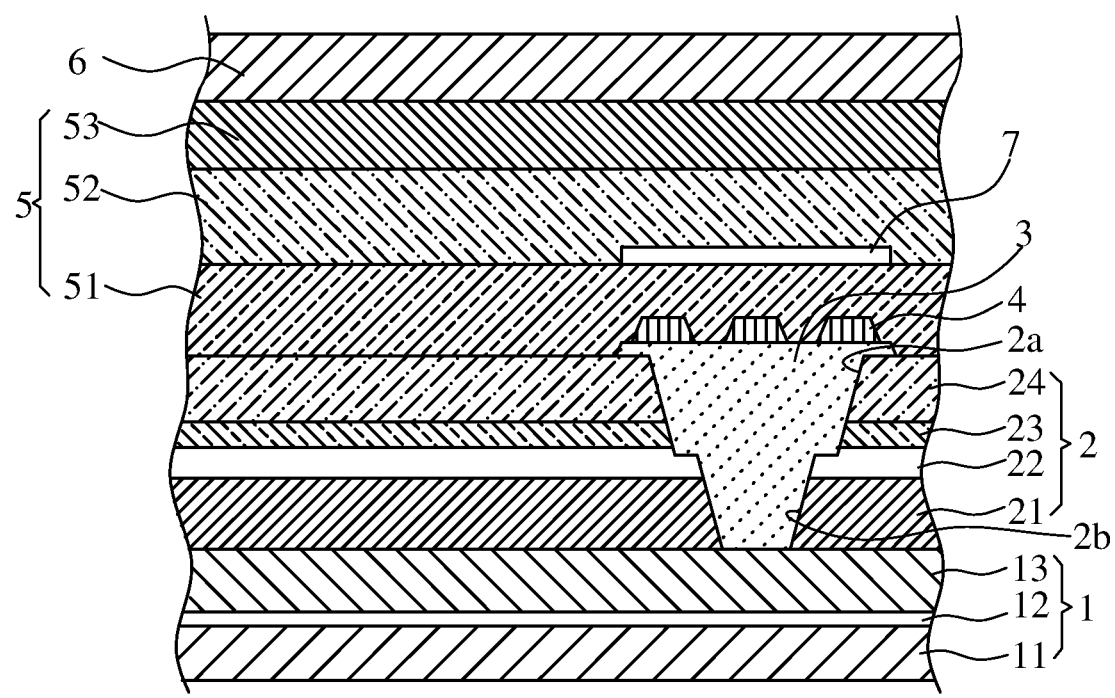
FIG. 2 is a schematic diagram illustrating a structure of a flexible array substrate of an embodiment of the present disclosure.

Please refer to FIG. 2, one aspect of the present disclosure provides a flexible array substrate, which may include a substrate 1, an insulation layer 2, an organic photoresist body 3, a source/drain electrode wiring 4, an organic photoresist layer 5, a photosensitive adhesive layer 6, and a stress cushion layer 7. The following examples illustrate embodiments of the above flexible array substrate, but are not limited thereto.

For example, as shown in FIG. 2, the insulation layer 2 may be disposed on the substrate 1, wherein the insulation layer 2 has a stepped through-hole. The organic photoresist body 3 may be disposed in the stepped through-hole of the insulation layer 2 on the substrate 1, for example, an outside diameter of the organic photoresist body 3 is gradually increased from an end of the organic photoresist body 3 close to the substrate 1 toward the other end of the organic photoresist body 3 away from the substrate 1. The source/drain electrode wiring 4 may be disposed over the organic photoresist body 3. The organic photoresist layer 5 may be disposed over the source/drain electrode wiring 4. The photosensitive adhesive layer 6 may be disposed over the organic photoresist layer 5. The stress cushion layer 7 may be disposed over the source/drain electrode wiring 4. For example, the stress cushion layer 7 may be disposed in the organic photoresist layer 5, in the photosensitive adhesive layer 6, or between the organic photoresist layer 5 and the photosensitive adhesive layer 6, according to actual requirements. The stress cushion layer 7 disposed on the organic photoresist layer 5 is only taken as an example of an explanation, but is not limited thereto.

Figure 1:
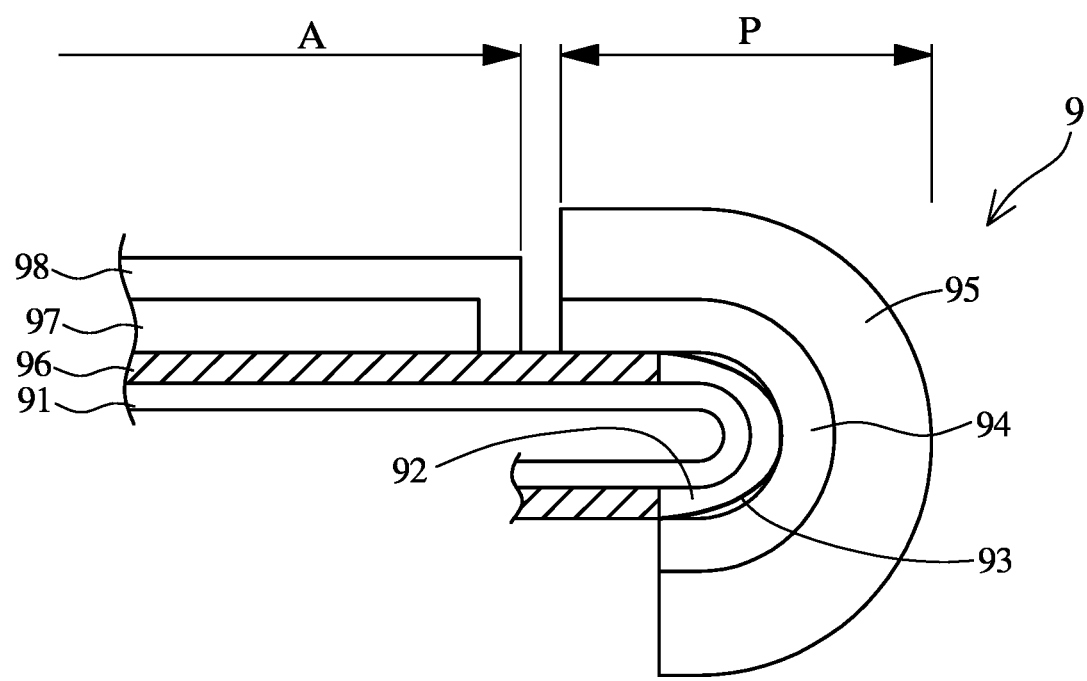
FIG. 1 is a schematic diagram illustrating for bending a conventional flexible array substrate.

It should be understood that, as shown in FIG. 2, when an area around the source/drain electrode wiring 4 which is served as a pad area of the flexible array substrate (marked as P shown in FIG. 1) and is bent, the stress cushion layer 7 can balance the stress between layers above and below the source/drain electrode wiring 4, but is not limited thereto. The above configuration of the flexible array substrate, such as the area around the source/drain electrode wiring 4, should not be limited to be used only for bending as the pad area. For example, the above configuration of the flexible array substrate can be in a state of not being bent. In addition, when the above configuration of the flexible array substrate is in a state of being bent, it can be used as a pad area capable of stress balance.

Specifically, as shown in FIG. 2, since a case of that imbalanced stress between the layers above and below the source/drain electrode wiring 4 mainly occurs when the above configuration of the flexible array substrate served as the pad area is bent. Accordingly, the stress cushion layer 7 should be made of a material or formed of a structure that is adapted to be bent and capable of stress balance. For example, the stress cushion layer 7 may be selected to a material or a structure with a large value of the Young's modulus in consideration of the material or structure based on the foregoing requirements. Taking an example, a range of the Young's modulus of the stress cushion layer 7 is preferably selected between 50 and 200 GPa, such as 75, 100, 125, 150, or 175 GPa, but is not limited thereto, in order to produce a more beneficial stress balance effect.

Therefore, when the above configuration of the flexible array substrate served as the pad area is bent, if a difference of the stress between the layers above and below the source/drain electrode wiring is too large, then the Young's modulus characteristic of the stress cushion layer can be utilized to balance the stress between the layers above and below the source/drain electrode wiring, so that the stress around the source/drain electrode wiring can be appropriately distributed to facilitate for bending. Thus, it is suitable for applying the flexible array substrate to a display device with a narrow border.

In some embodiments, as shown in FIG. 2, the substrate 1 may include at least one Polyimide (PI) layer. For example, the substrate 1 may include two Polyimide layers 11, 13 and a first cushion layer 12, wherein the first cushion layer 12 may be disposed between the two Polyimide layers 11 and 13. In addition, the Young's modulus of the material of the first cushion layer 12 is about 100 GPa. Thus, it can be used to assist in balancing the stress when the flexible array substrate is bent.

In some embodiments, the insulation layer 2 and the organic photoresist body 3 are disposed on a same surface of the substrate 1 (such as an upper surface of the substrate 1 shown in FIG. 2). For, example, a shoulder is formed on an outer circumferential surface between two ends of the organic photoresist body 3. The organic photoresist body 3 may be disposed in the stepped through-hole of the insulation layer 2 on the substrate 1. The stepped through-hole includes a first tapered-hole portion 2a and a second tapered-hole portion 2b, wherein a minimum aperture of the first tapered-hole portion 2a is larger than a maximum aperture of the second tapered-hole portion 2b, and a ring portion is formed between the first tapered-hole portion 2a and the second tapered-hole portion 2b.

Specifically, as shown in FIG. 2, at least one thin film transistor (explained as follows) is disposed in the insulation layer 2 and is configured to provide pixels control function. The insulation layer 2 further includes a second cushion layer 21, which is disposed on the substrate 1, wherein the at least one thin film transistor may be disposed over the second cushion layer 21. For example, at least one gate insulation layer (such as 22 to 24 shown in FIG. 2) may be sequentially disposed on the second cushion layer 21 to provide a gate required in various configurations of the thin film transistor.

In some embodiment, as shown in FIG. 2, the outer circumferential surface of the organic photoresist body 3 corresponds to a shape of the stepped through-hole of the insulation layer 2. For example, the organic photoresist body 3 may include a first pyramid portion and a second pyramid portion, wherein a minimum outside diameter of the first pyramid is greater than a maximum outside diameter of the second pyramid portion. The shoulder portion formed on the outer circumferential surface of the organic photoresist body 3 between the two ends of the organic photoresist body 3 corresponds to the ring portion between the first tapered-hole portion 2a and the second tapered-hole portion 2b.

In some embodiments, as shown in FIG. 2, the source/drain electrode wiring 4 may be disposed over the organic photoresist body 3. For example, the source/drain electrode wiring 4 may be patterned and electrically connected to a source and a drain of the at least one thin film transistor in the insulation layer 2 via conductors in contact-holes (via).

In some embodiments, as shown in FIG. 2, the organic photoresist layer 5 may include a plurality of film layers, such as a planarization layer (PLN) 51 and a pixel definition layer (PDL) 52. The planarization layer 51 may be used to cover the insulation layer 2 and expose objects on the upper surface of the insulation 2, such as the organic photoresist body 3 and the source/drain electrode wiring 4. The pixel definition layer (PDL) 52 may be disposed over the planarization layer 51 to define a plurality of pixels (such as red, green, and blue pixels) of a display device. In addition, the organic photoresist layer 5 may also include a photo spacer layer (PS) 53, wherein the photo spacer layer 53 may be disposed over the pixel definition layer 52 to adjust a gap required for the substrate.

In some embodiments, as shown in FIG. 2, the photosensitive adhesive layer 6 may be disposed on the organic photoresist layer 5. In addition, the photosensitive adhesive layer 6 is made of a material that is sensitive to specific spectrums, for example, ultraviolet (UV) photosensitive glue.

Figure 3:
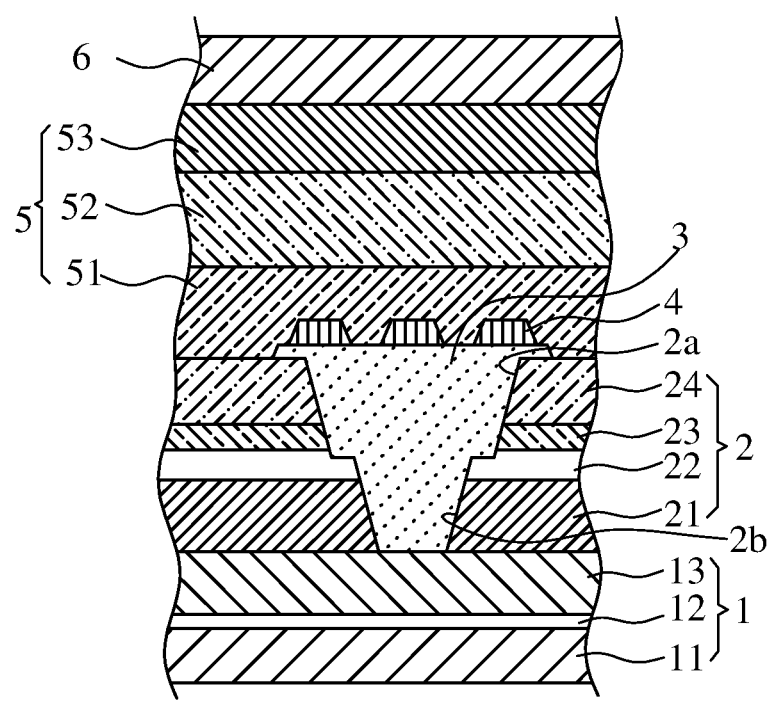
FIG. 3 is a schematic diagram illustrating a structure of the flexible array substrate without a stress cushion layer shown in FIG. 2.

In some embodiments, as shown in FIG. 2, the stress cushion layer 7 may be consisted of at least one of an inorganic film layer, a metal film layer, and an organic film layer. A thickness of the stress cushion layer 7 is varied as a distance from the source/drain electrode wiring 4, wherein the thickness of the stress cushion layer 7 is thicker as the stress cushion layer is closer to the source/drain electrode wiring 4. For example, the thickness of the stress cushion layer 7 may be ranged from 20 to 15000 nm, such as 100, 500, 1000, 3500, 5000, 7500, 10000, 12500, 14500, and 14900, but is not limited thereto. In addition, the stress cushion layer is shaped as a sliced structure or a patterned structure, for example, the patterned structure may be configured to be shaped as strip, round, or chain, but is not limited thereto. In addition, the stress cushion layer 7 may be disposed between the planarization layer 51 and the pixel definition layer 52 to get a prefer effect of stress cushion. However, the stress cushion layer 7 may also be disposed at other film layers over the source/drain electrode wiring 4, so as to use high Young's modulus characteristic (such as a range of the Young's modulus between 50 and 200 Gpa) of the stress cushion layer 7. When the pad area (i.e., around the organic photoresist body 3) of the flexible array substrate is bent, the stress between an inner side and an outer side of the flexible array substrate is balanced. Compared with other flexible array substrate without the stress cushion layer (as shown in FIG. 3), the stress cushion layer 7 of the present disclosure can solve a problem that the stress is imbalanced at a position of pad bending, and has no defects caused by increasing a thickness of film layers. The following is an example of the fabrication of the flexible array substrate of the embodiment of the present disclosure, but is not limited thereto.

For example, as shown in FIGS. 4 to 14, a manufacturing method of the flexible array substrate may include the following steps, but not limited thereto.

Figure 4:
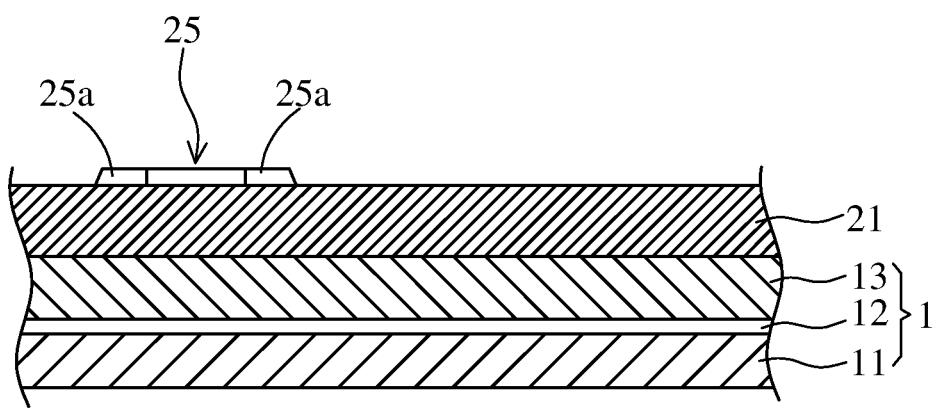
FIG. 4 is a diagram illustrating a fabrication example of a first part of the flexible array substrate of the embodiment of the present disclosure.

(1) As shown in FIG. 4, the Polyimide layer 11 served as a first flexible substrate may be coated on a glass substrate (not shown), and the first cushion layer 12 is deposited on the first flexible substrate, then the Polyimide layer 13 served as a second flexible substrate is coated on the first cushion layer 12 to form a substrate 1 with a dual PI structure.

(2) As shown in FIG. 4, the second cushion layer 21 and materials of an active layer are deposited over the substrate 1, for example, a patterning process is performed to form an active layer 25 and source/drain 25a of the thin film transistor.

Figure 5:
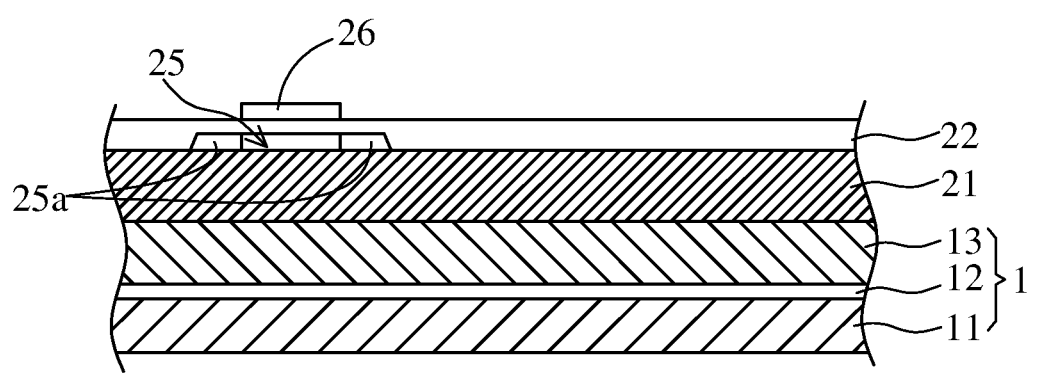
FIG. 5 is a diagram illustrating a fabrication example of a second part of the flexible array substrate of the embodiment of the present disclosure.

(3) As shown FIG. 5, a first gate insulation layer (GI1) 22 and a first metal layer are deposited over the active layer 25, for example, the first metal layer is patterned to form a gate 26 of the thin film transistor and such as scan wirings (not shown).

Figure 6:
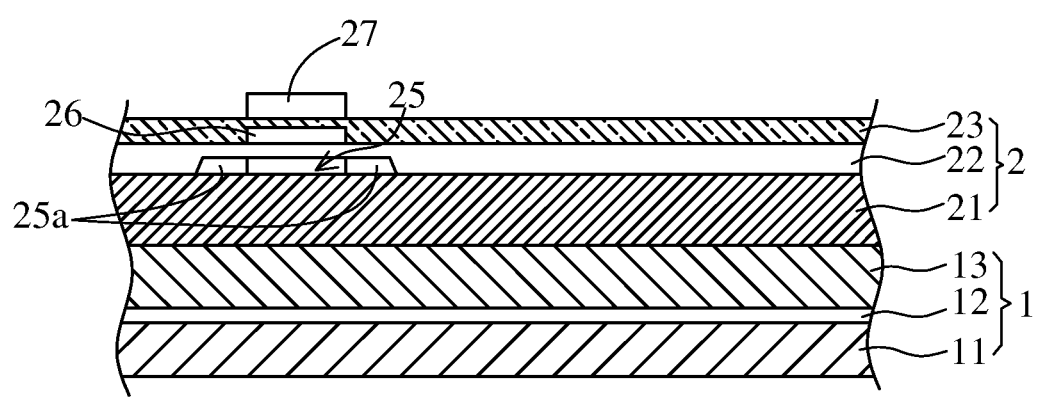
FIG. 6 is a diagram illustrating a fabrication example of a third part of the flexible array substrate of the embodiment of the present disclosure.

(4) As shown in FIG. 6, a second gate insulation layer (GI2) 23 and a second metal layer are deposited over the gate 26, for example, the second metal layer is patterned to form a second electrode 27 of a capacitor and such as discharge lines (not shown).

Figure 7:
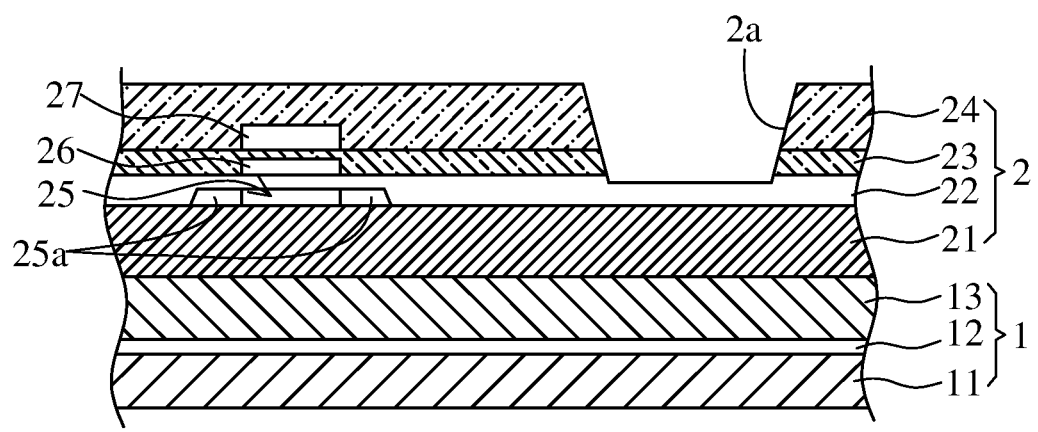
FIG. 7 is a diagram illustrating a fabrication example of a fourth part of the flexible array substrate of the embodiment of the present disclosure.

(5) As shown in FIG. 7, an inter-layered insulation layer (ILD) 24 is deposited over the second metal layer. A position of a pad area (i.e., an area where the organic photoresist is prepared) is firstly etched to form the first tapered-hole portion 2a passing through the inter-layered insulation layer 24 and the second gate insulating layer 23, and recessing into the first gate insulating layer 22.

Figure 8:
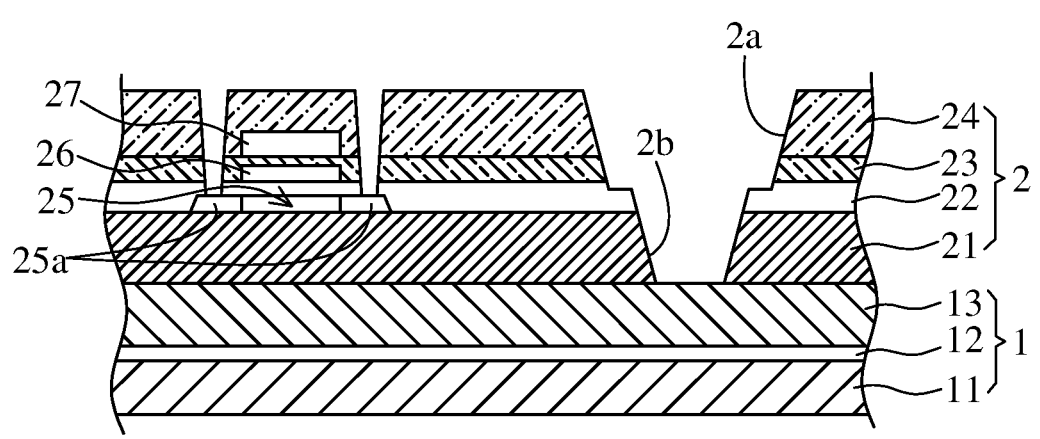
FIG. 8 is a diagram illustrating a fabrication example of a fifth part of the flexible array substrate of the embodiment of the present disclosure.

(6) As shown in FIG. 8, the inter-layered insulation layer 24 is secondly etched, for example, the second tapered-hole portion 2b is formed downwardly at the first tapered-hole portion 2a, and two contact-holes for the source/drain (for contacting the source/drain 25a) are formed at a position corresponding to the source/drain 25a.

Figure 9:
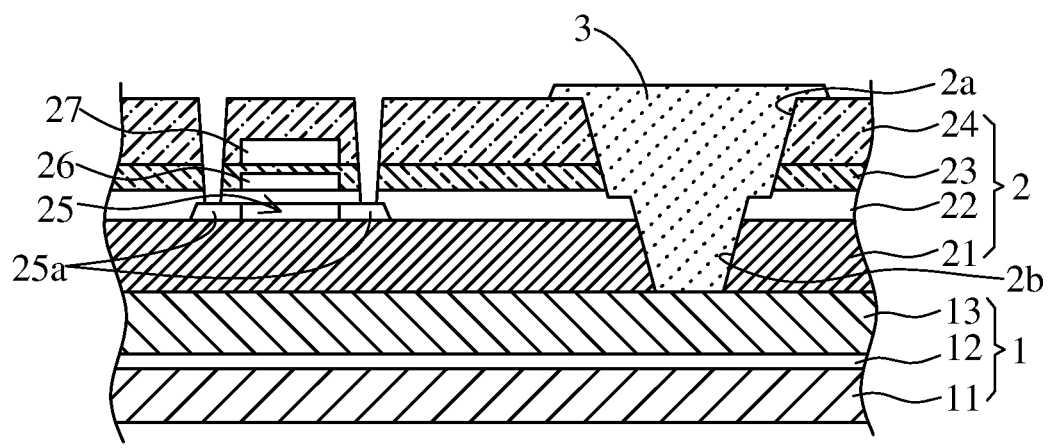
FIG. 9 is a diagram illustrating a fabrication example of a sixth part of the flexible array substrate of the embodiment of the present disclosure.

(7) As shown in FIG. 9, the stepped through-hole formed by the first tapered-hole portion 2a conjugated with the second tapered-hole portion 2b are filled with an organic photoresist to form the organic photoresist body 3.

Figure 10:
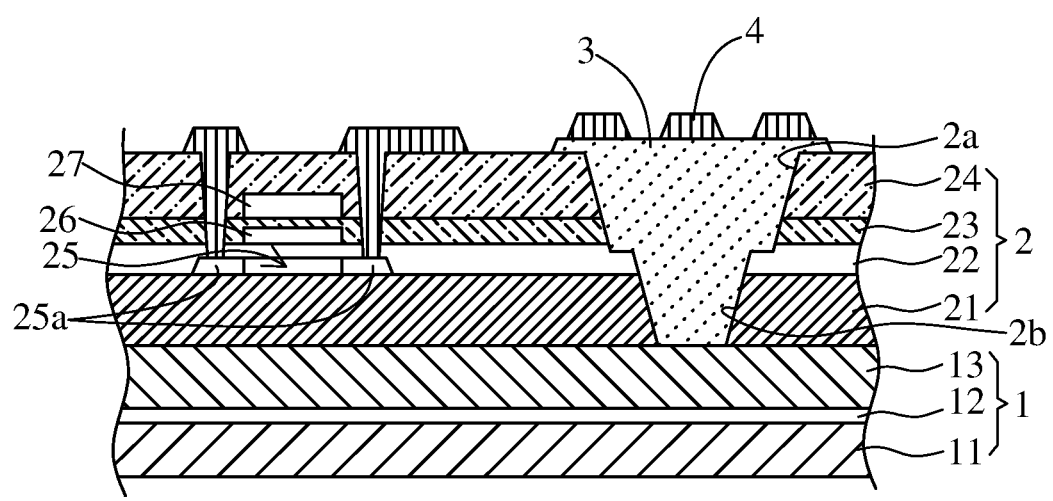
FIG. 10 is a diagram illustrating a fabrication example of a seventh part of the flexible array substrate of the embodiment of the present disclosure.

(8) As shown in FIG. 10, the source/drain electrode wiring 4 is deposited over the inter-layered insulation layer 24, for example, another patterning process is performed over the organic photoresist body 3 to form the source/drain electrode wiring 4.

Figure 11:
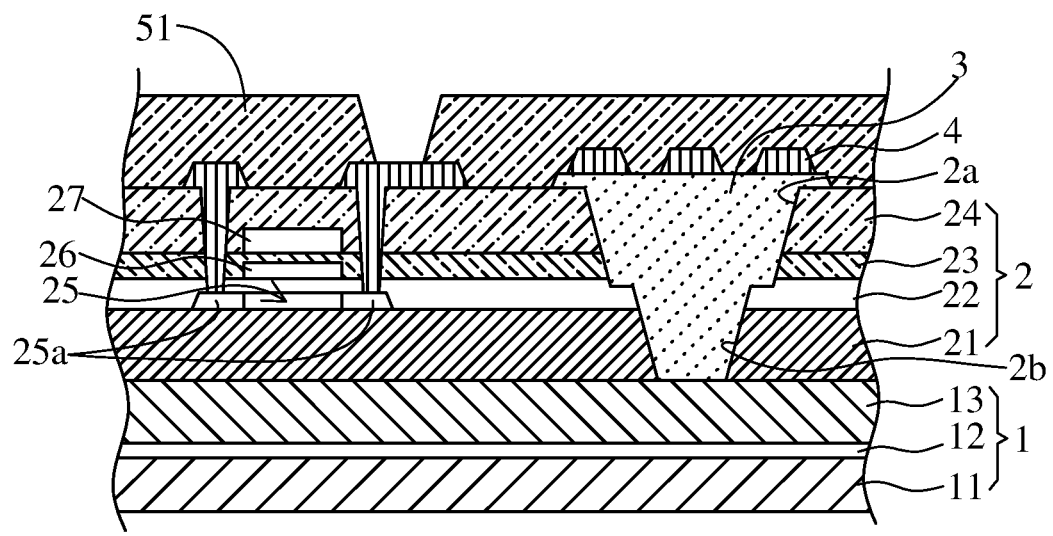
FIG. 11 is a diagram illustrating a fabrication example of an eighth part of the flexible array substrate of the embodiment of the present disclosure.

(9) As shown in FIG. 11, organic film layers are coated over the inter-layered insulation layer 24, for example, another patterning process is performed to form the planarization layer (PLN) 51.

Figure 12:
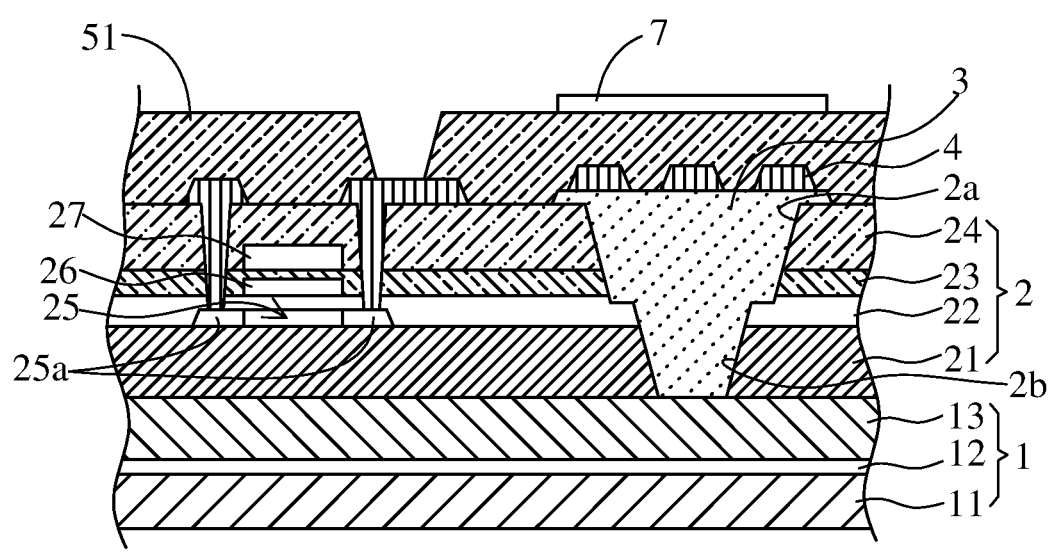
FIG. 12 is a diagram illustrating a fabrication example of an ninth part of the flexible array substrate of the embodiment of the present disclosure.

(10) As shown in FIG. 12, the stress cushion layer 7 is deposited over the planarization layer 51, for example, another patterning process is performed to remain a part over the source/drain electrode wiring 4 within the pad area.

Figure 13:
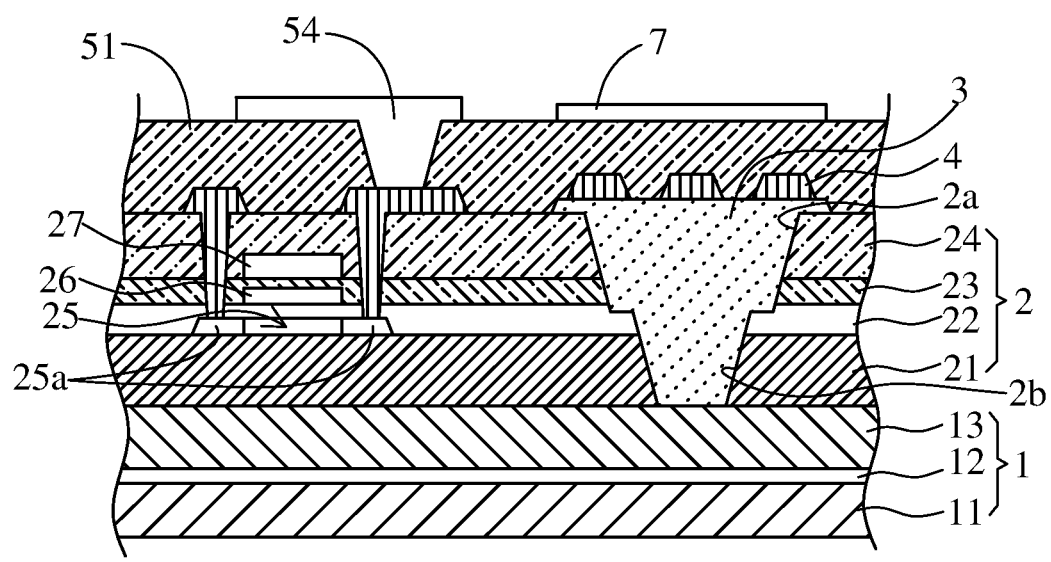
FIG. 13 is a diagram illustrating a fabrication example of a tenth part of the flexible array substrate of the embodiment of the present disclosure.

(11) As shown in FIG. 13, an anode metal material is deposited over the planarization layer 51, for example, another patterning process is performed to form an anode (ANO) 54.

Figure 14:
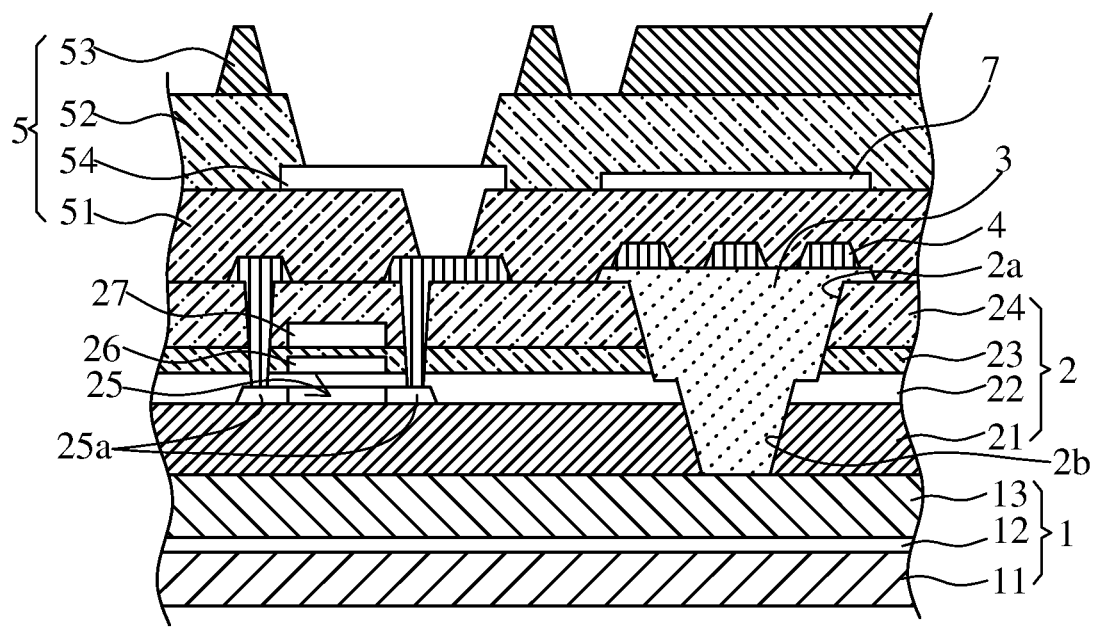
FIG. 14 is a diagram illustrating a fabrication example of an eleventh part of the flexible array substrate of the embodiment of the present disclosure.

(12) As shown in FIG. 14, an organic photoresist is coated over the anode 54, for example, another patterning process is performed to form the pixel definition layer (PDL) 52 and the photo spacer layer 53.

Another aspect of the present disclosure provides a display device, which includes the aforementioned flexible array substrate. For example, it may be divided into an active area and a pad area, wherein the active area is a portion that is can be used for display, and wherein the pad area is a portion that is used for pad bending, such as a part containing the stress cushion layer of the flexible array substrate.

Compared with the prior art, the flexible array substrate and the display device including the flexible array substrate of the present disclosure are provided with the stress cushion layer (for example, the Young's modulus ranging from 50 to 200 GPa) in one of film layers above the source/drain electrode wiring. When the pad area (i.e., around the organic photoresist body) of the flexible array substrate is bent, the stress in the flexible array substrate can be balanced. In this way, a problem of stress imbalance at a position for pad bending in the prior art can be solved, and there is no disadvantage of increasing the thickness of the film layers in the prior art, which is advantageous for realizing a display device with a narrow border.

The present disclosure has been described by the above related embodiments, but the above embodiments are merely examples for implementing the present disclosure. It must be noted that the disclosed embodiments do not limit the scope of the disclosure. On the contrary, the scope of the present disclosure includes modifications and equivalent arrangements involved in spirit and scope of claims.

What is claimed is:

1. A flexible array substrate, comprising:
   a substrate;
   an insulation layer disposed on the substrate, wherein the insulation layer has a stepped through-hole, the stepped through-hole comprises a first tapered-hole portion and a second tapered-hole portion, a minimum aperture of the first tapered-hole portion is larger than a maximum aperture of the second tapered-hole portion, and a ring portion is formed between the first tapered-hole portion and the second tapered-hole portion;
   an organic photoresist body disposed in the stepped through-hole of the insulation layer on the substrate;
   a source/drain electrode wiring disposed over the organic photoresist body;
   an organic photoresist layer disposed over the source/drain electrode wiring;
   a photosensitive adhesive layer disposed over the organic photoresist layer; and
   a stress cushion layer disposed over the source/drain electrode wiring, wherein the stress cushion layer is disposed in the organic photoresist layer, in the photosensitive adhesive layer, or between the organic photoresist layer and the photosensitive adhesive layer.

2. The flexible array substrate as claimed in claim 1, wherein the organic photoresist layer comprises a planarization layer and a pixel definition layer, and the stress cushion layer is disposed between the planarization layer and the pixel definition layer.

3. The flexible array substrate as claimed in claim 1, wherein a thickness of the stress cushion layer is varied as a distance from the source/drain electrode wiring, and wherein the thickness of the stress cushion layer is thicker as the stress cushion layer is closer to the source/drain electrode wiring.

4. The flexible array substrate as claimed in claim 1, wherein the stress cushion layer consists of at least one of an inorganic film layer, a metal film layer, and an organic film layer.

5. The flexible array substrate as claimed in claim 1, wherein the stress cushion layer is shaped as a sliced structure or a patterned structure.

6. The flexible array substrate as claimed in claim 1, wherein the insulation layer and the organic photoresist body are disposed on a same surface of the substrate, wherein an outside diameter of the organic photoresist body is gradually increased from an end of the organic photoresist body close to the substrate toward the other end of the organic photoresist body away from the substrate.

7. The flexible array substrate as claimed in claim 6, wherein a shoulder is formed on an outer circumferential surface between two ends of the organic photoresist body.

8. A flexible array substrate, comprising:
a substrate;
an insulation layer disposed on the substrate, wherein the insulation layer has a stepped through-hole;
an organic photoresist body disposed in the stepped through-hole of the insulation layer on the substrate;
a source/drain electrode wiring disposed over the organic photoresist body;
an organic photoresist layer disposed over the source/drain electrode wiring;
a photosensitive adhesive layer disposed over the organic photoresist layer; and
a stress cushion layer disposed over the source/drain electrode wiring.

9. The flexible array substrate as claimed in claim 8, wherein the stress cushion layer is disposed in the organic photoresist layer, in the photosensitive adhesive layer, or between the organic photoresist layer and the photosensitive adhesive layer.

10. The flexible array substrate as claimed in claim 9, wherein the organic photoresist layer comprises a planarization layer and a pixel definition layer, and the stress cushion layer is disposed between the planarization layer and the pixel definition layer.

11. The flexible array substrate as claimed in claim 8, wherein a thickness of the stress cushion layer is varied as a distance from the source/drain electrode wiring, and wherein the thickness of the stress cushion layer is thicker as the stress cushion layer is closer to the source/drain electrode wiring.

12. The flexible array substrate as claimed in claim 8, wherein the stress cushion layer consists of at least one of an inorganic film layer, a metal film layer, and an organic film layer.

13. The flexible array substrate as claimed in claim 8, wherein the stress cushion layer is shaped as a sliced structure or a patterned structure.

14. The flexible array substrate as claimed in claim 8, wherein the insulation layer and the organic photoresist body are disposed on a same surface of the substrate, wherein an outside diameter of the organic photoresist body is gradually increased from an end of the organic photoresist body close to the substrate toward the other end of the organic photoresist body away from the substrate.

15. The flexible array substrate as claimed in claim 14, wherein a shoulder is formed on an outer circumferential surface between two ends of the organic photoresist body.

16. The flexible array substrate as claimed in claim 8, wherein the stepped through-hole comprises a first tapered-hole portion and a second tapered-hole portion, a minimum aperture of the first tapered-hole portion is larger than a maximum aperture of the second tapered-hole portion, and a ring portion is formed between the first tapered-hole portion and the second tapered-hole portion.

17. A display device, comprising the flexible array substrate as claimed in claim 8.

* * * * *